United States Patent
Baker et al.

(10) Patent No.: US 7,168,006 B2
(45) Date of Patent: Jan. 23, 2007

(54) METHOD AND SYSTEM FOR SAVING THE STATE OF INTEGRATED CIRCUITS UPON FAILURE

(75) Inventors: Marcus A. Baker, Apex, NC (US); Jeffrey B. Williams, Raleigh, NC (US); Sheldon J. Sigrist, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 568 days.

(21) Appl. No.: 10/609,892

(22) Filed: Jun. 30, 2003

(65) Prior Publication Data

US 2004/0264285 A1    Dec. 30, 2004

(51) Int. Cl.
    *G06F 11/00*  (2006.01)
(52) U.S. Cl. ............... 714/34; 714/30; 714/42
(58) Field of Classification Search ............. 714/42, 714/43, 44, 30, 34
    See application file for complete search history.

(56) References Cited

U.S. PATENT DOCUMENTS

| | | | | |
|---|---|---|---|---|
| 5,619,644 | A | 4/1997 | Crockett et al. | 395/183.21 |
| 5,630,048 | A | 5/1997 | La Joie et al. | 395/183.01 |
| 5,928,368 | A | 7/1999 | Jardine et al. | 714/22 |
| 5,933,594 | A | 8/1999 | La Joie et al. | 395/183.01 |
| 6,148,348 | A | 11/2000 | Garnett et al. | 710/14 |
| 6,202,174 | B1 | 3/2001 | Lee et al. | 714/38 |
| 6,243,831 | B1 | 6/2001 | Mustafa et al. | 714/24 |
| 6,393,582 | B1 | 5/2002 | Klecka et al. | 714/11 |
| 6,516,434 | B1 | 2/2003 | Willekes et al. | 714/738 |
| 6,539,341 | B1 | 3/2003 | Khandelwal et al. | 702/187 |
| 6,681,348 | B1* | 1/2004 | Vachon | 714/45 |
| 6,779,145 | B1* | 8/2004 | Edwards et al. | 714/733 |
| 2002/0078404 | A1* | 6/2002 | Vachon et al. | 714/38 |
| 2002/0162037 | A1* | 10/2002 | Woods et al. | 713/322 |
| 2003/0056154 | A1* | 3/2003 | Edwards et al. | 714/45 |
| 2003/0145142 | A1* | 7/2003 | Masuyama et al. | 710/100 |

FOREIGN PATENT DOCUMENTS

JP    4025941    1/1992

OTHER PUBLICATIONS

Powley, Ian. The Beginner's Guide to ASICs. 1988. European Silicon Structures Limited. pp. 1-2, 21. http://web.ukonline.co.uk/paul.naish/b_guide.htm.*
"EEPROM" Microsoft Computer Dicitonary (fifth edition). Copyright 2002. Microsoft Press.*
Bowen, Nicholas S. et al., "Virtual Checkpoints: Architecture and Performance," IEEE Transactions on Computers, vol. 41, No. 5, May 1992, pp. 516-525.

* cited by examiner

*Primary Examiner*—Robert Beausoliel
*Assistant Examiner*—Matthew Urick
(74) *Attorney, Agent, or Firm*—Sawyer Law Group LLP

(57) ABSTRACT

Method and system for saving the state of integrated circuit chips upon failure. In one aspect of the invention, a system for saving the state of an integrated circuit includes a non-volatile memory and a state-saving controller coupled to the non-volatile memory and coupled to the integrated circuit, where the state-saving controller saves the state of the integrated circuit to the non-volatile memory when a failure occurs in the integrated circuit.

32 Claims, 2 Drawing Sheets

METHOD AND SYSTEM FOR SAVING THE STATE OF INTEGRATED CIRCUITS UPON FAILURE

FIELD OF THE INVENTION

The present invention relates to the operation of integrated circuits, and more particularly to the recovery from failures of processors and other integrated circuits.

BACKGROUND OF THE INVENTION

Interated circuits are used in a wide variety of applications. For example, servers are used to provide a variety of processing and storage functions in computer systems. Application Specific Integrated Circuits (ASICs), microprocessor chips, memory chips, and other integrated circuit chips of various forms provide much of the control and functionality of the servers. At various times, however, integrated circuits and chipsets can fail during operation due to any of many possible reasons.

In some servers and other computer devices, one or more microprocessors or other circuits can be used to monitor the operation of the server (or other device). This "service processor" can monitor the operation of the server and determine if and when a failure occurs in the server, and whether that failure is caused by the hardware or software of the server itself, or by some other cause.

When a failure does occur in the server system, the service processor can check if it is an uncorrectable error, i.e., an error which requires servicing by the server operator or provider, and which cannot be easily or immediately be corrected by the service processor. If the error is uncorrectable, each ASIC, microprocessor, or other integrated circuit processing chip of the server can lock the state of all of its internal latches at the time of the error. The service processor can then dump or save the data contents of certain registers of the locked chips, so that the data in these registers can be later examined to help determine the nature of the error and the source or cause of the error. The service processor dumps this register data contents to the service processor's memory.

Some problems can occur with the above situation where the service processor dumps an integrated circuit chip's registers after an uncorrectable error. One problem is that the service processor has a finite memory capacity used mainly for its own functions, and thus cannot dump and save the contents of even a substantial number of the latches of the integrated circuit chip. Another problem is that the service processor is programmed beforehand to dump specific registers of the integrated circuit chip. The registers chosen to be dumped by the service processor are usually determined and selected based on previous debugging sessions of the integrated circuit chip, e.g., particular errors were found in earlier debugging stages and the pertinent registers for those found errors are chosen to be dumped for future chip failures. Therefore, there is a chance that when a new type of failure occurs in the integrated circuit chip, not all of the correct latches and registers of the chip that will lead to a successful determination of the error will have been dumped by the service processor.

SUMMARY OF THE INVENTION

The invention of the present application provides a method and system for saving the state of integrated circuits upon failure. In a first aspect of the present invention, a system for saving the state of an integrated circuit includes a non-volatile memory, and a state-saving controller coupled to the non-volatile memory and coupled to the integrated circuit, where the state-saving controller saves the state of the integrated circuit to the non-volatile memory when a failure occurs in the integrated circuit. In a second aspect of the present invention, a method for saving the state of an integrated circuit includes determining that an error has occurred in the operation of the integrated circuit, and saving the state of the integrated circuit to a non-volatile memory coupled to the integrated circuit, the state saved after the error has been detected. In a third aspect of the present invention, a computer readable medium includes program instructions to be implemented by a computer, the program instructions implementing steps for saving the state of an integrated circuit, the steps including determining that an error has occurred in the operation of the integrated circuit, and saving the state of the integrated circuit to a non-volatile memory coupled to the integrated circuit, the state saved after the error has been detected.

The present invention provides methods and apparatus for saving the state of an integrated circuit when a failure occurs in the circuit. Since the state of the integrated circuit is saved to a dedicated memory, substantially all the latches of the integrated circuit can be saved instead of only particular registers, thus allowing a thorough examination of the state of the integrated circuit at the time of failure and leading to potentially more effective debugging operations and fixes of the circuit. These and other advantages are set forth in greater detail in the specification and drawings provided below.

DETAILED DESCRIPTION

The present invention relates to the operation of integrated circuits, and more particularly to the recovery from failures of processor and other integrated circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
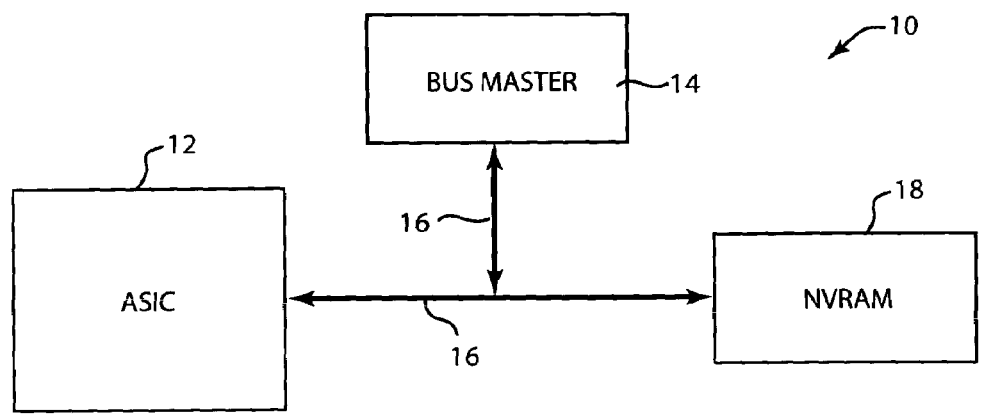
FIG. 1 is a block diagram of a system of the present invention for saving the state of an integrated circuit.

FIG. 1 is a block diagram of a system 10 of the present invention. System 10 includes an Application Specific Integrated Circuit (ASIC) 12, a bus master device 14, a bus 16, and a memory device 18.

ASIC 12 is included in a server or other type of computer device. The function of the ASIC can vary greatly depending on the specific application for which it is provided and programmed. For example, in a server system, the ASIC 12 can be used in the general operation of the server, e.g., to perform computations and other functions, store and retrieve data from memory, communicate with other components of the server system, etc. Or the ASIC 12 can be used in more specific and narrow applications. The server or other computer device with which the ASIC 12 operates can include various other well-known components, including microprocessor(s), memory, storage devices, communication and I/O devices, etc. For example, in one embodiment, ASIC 12 can be one or more chips in the Pecos chipset from IBM Corp. or similar types of chips.

In other embodiments, other types of integrated circuits 12, such as microprocessors, other processors, and the like, can be used instead of ASIC 12 in all the embodiments of the invention. For example, integrated circuit chips such as Field Programmable Gate Arrays (FPGAs) or Custom Programmable Logic Devices (CPLDs), can be used in any embodiment of the present invention.

ASIC 12 has a number of laches for storing data for and during various uses and operations of the ASIC. For example, some laches are used as registers for the ASIC, e.g., for the temporary storage of data during operations and indications of the states of components of the ASIC. Other laches may save the state of data paths of the ASIC, the state of memory of the ASIC, or another relevant state. These types of latches may be useful for determining the state of the ASIC upon failure.

Bus master device 14 is included in system 10 and operates as a state-saving controller for the present invention to manage the retrieval and storage of data from the ASIC 12 when an uncorrectable error occurs in the system. Bus master 14 also can control the bus 16, e.g., control what devices can send and receive data over the bus 16. For example, bus master 14 can be a controller that is an integrated circuit, an ASIC, a microprocessor, or other circuit that can be programmed via software and/or hardware. In the present embodiment of FIG. 1, bus master 14 is implemented as an external, separate unit or chip from the ASIC 12. In the present invention, bus master 14 and its state-saving controller are dedicated to saving the state of the ASIC to memory, and do not perform any other functions or act as a general service processor (e.g., a service processor typically provides many functions including monitoring temperatures of server components, allowing remote control of the server or computer, powering the server/computer on or off, etc.).

Bus 16 is coupled to the ASIC 12 and to the bus master 14 and is used to transfer data from the ASIC to a memory 18 (described below). In the described embodiment, bus 16 is a serial bus, but the bus can be a different type of bus in other embodiments (parallel bus, etc.) The bus master 14 can communicate with the ASIC 12 over the serial bus 16 without having to first communicate with a CPU or other microprocessor of the computer system. The serial bus 16 allows serial transfer of data to or from the ASIC to other devices connected to the serial bus. In the preferred embodiment, the bus master 14 and the memory 18 are the only two devices on the serial bus 16 besides the ASIC 12. Serial bus 16 can be any of a variety of types of buses. For example, in one embodiment, bus 16 is an I2C bus (Inter-IC bus) and bus master 14 is an I2C master. The I2C bus is a multi-master bus that can be used to allow many types of integrated circuits and devices to communicate.

Non-Volatile Random Access Memory (NVRAM) 18 is included in system 10 and is in communication with the ASIC 12 and the bus master 14 via serial bus 16. NVRAM 18 is a non-volatile memory and can hold data even when the power to the ASIC 12 and to the memory is discontinued, and thus is suitable to hold diagnostic data after system failures. Such data can be retrieved from the NVRAM at a time after failure for debugging purposes. For example, NVRAM 18 can be an Electrically Erasable Programmable Read Only Memory (EEPROM), static random access memory (SRAM), or other type of non-volatile memory. In alternate embodiments, other types of memory can be used which is able to reliably retain data after failures of the ASIC 12 or other components of the larger system of which ASIC 12 is a part.

In the present invention, bus master 14 reads the latches of ASIC 12 and stores the latch data in NVRAM 18 over the serial bus 16, i.e., the state of the ASIC 12 (between resets and power cycles of the server or computer device) is "dumped" to the NVRAM 18. In the described embodiment, NVRAM 18 thus acts as a slave serial device on the serial bus 16. The process of the present invention of saving the state of the integrated circuit 12 is described in greater detail with respect to FIG. 4, below.

Figure 2:
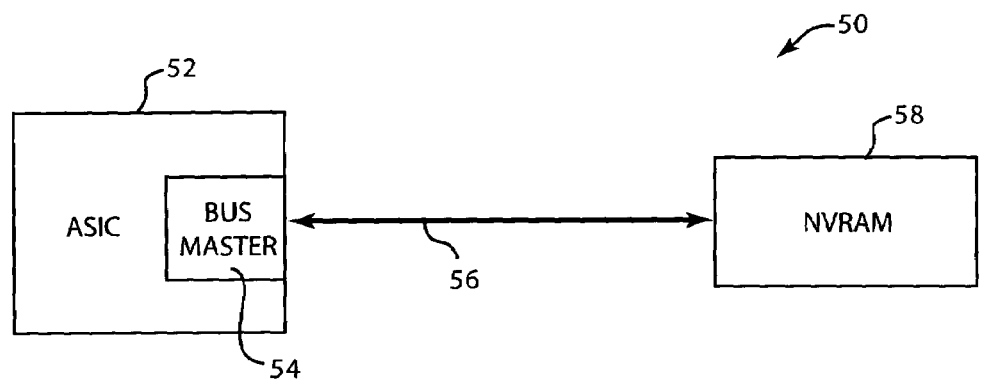
FIG. 2 is a block diagram of a second embodiment of the present invention for saving the state of an integrated circuit.

FIG. 2 is a block diagram of a different embodiment 50 of the system of the present invention for saving the state of an integrated circuit. System 50 includes an ASIC 52, a bus master device 54, a bus 56, and NVRAM 58.

Integrated circuit 52, such as ASIC 52, performs tasks in the server or other computer device according to its programming, similar to the ASIC 12 described with respect to FIG. 1. Other types of integrated circuits may also be used. Bus master 54 is connected to a serial bus 56 (or other type of bus) and can provide data from the latches of the ASIC to the serial bus and control the serial bus, similar to the bus master 14 described with respect to FIG. 1. However, the bus master 54 is internal to, i.e., embedded within, the ASIC 52 rather than being implemented as a separate integrated circuit in a separate package. The embedding of the bus master 54 in ASIC 52 may allow the costs for producing these components to be reduced, but may require that the ASIC 52 be made more custom and specific to include this embodiment of the present invention.

Serial bus 56 and NVRAM 58 function similarly to their equivalent components in the embodiment 10 of FIG. 1, where the NVRAM 58 can receive data from latches of the ASIC 52 over the serial bus 56 as directed by the bus master 54 upon failure of the ASIC 52, and the NVRAM can store that data in a non-volatile manner to allow the data to be later accessed for debugging purposes.

Figure 3:
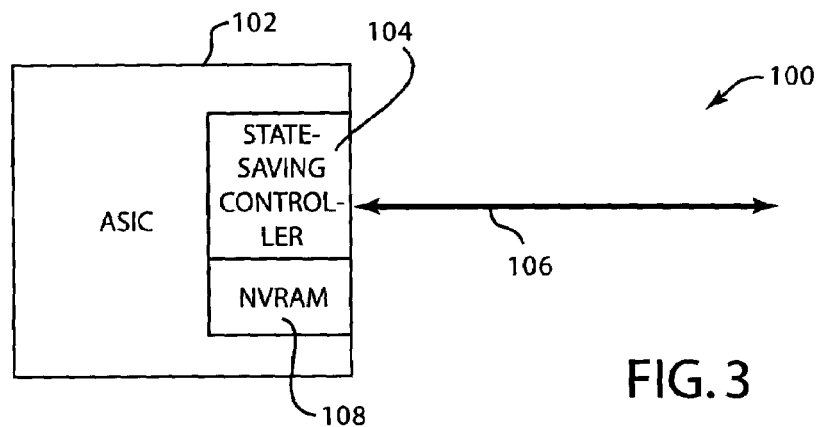
FIG. 3 is a block diagram of a third embodiment of the present invention for saving the state of an integrated circuit.

FIG. 3 is a block diagram of a different embodiment 100 of the system of the present invention for saving the state of an integrated circuit. System 100 includes an ASIC and a serial bus 106.

ASIC 102 is an integrated circuit that performs tasks in the server or other computer device according to its programming, similar to the ASICs 12 and 52 described above. Other types of integrated circuits may also be used. In the embodiment of FIG. 3, a state-saving controller 104 and NVRAM 108 are internal to the ASIC, i.e., integrated and embedded with the ASIC 102 and in the same package.

Since the NVRAM 108 is internal to the ASIC 102, no separate bus master device or similar external controller is needed to read the latches of the ASIC and send the latched data to the NVRAM over a bus. Rather, the state-saving controller 104 functionality is included within the ASIC circuitry and programming (which was included in the bus master of the previous embodiments), so that the state-saving controller 104 can store the latch data to the internal NVRAM upon an uncorrectable failure of the ASIC 102.

The integration of NVRAM 108 in the ASIC 102 may allow even greater consolidation of the components of the present invention into a single package, reducing the space required on a circuit board and reducing the assembly time of the circuits, but potentially raising the costs of the circuit and requiring a more custom and specific ASIC. Also, an internal NVRAM 108 does not allow as easy access to the NVRAM memory to read its contents for debugging purposes, e.g., in the embodiments of FIGS. 1 and 2 having a separate NVRAM, the NVRAM chip can be separately removed from the circuit board and its contents read more easily. Furthermore, there may be a chance that the failure in the ASIC affects the state-saving controller functionality of the ASIC as well, so that the operation of the invention is compromised and no latches get saved to the NVRAM. Thus, it is desirable that the state-saving controller of the present invention be made as independent as possible from the remaining functionality of the ASIC 102.

A serial bus 106 (or other type of bus) is preferably included in the embodiment 100 to allow an appropriate testing device to be later connected to the bus 106 and the ASIC 102 so that the data in the NVRAM 108 can be downloaded to a testing device for diagnostic purposes.

In yet another embodiment, the bus master/state-saving controller 104 and the NVRAM 108 can be integrated in one integrated circuit chip that is separate from the ASIC 102 and is connected to the ASIC by a bus 106, such as a serial bus. The bus master/controller 104 would control the dumping of latches to the NVRAM similarly to the embodiments of FIGS. 1 or 2.

Figure 4:
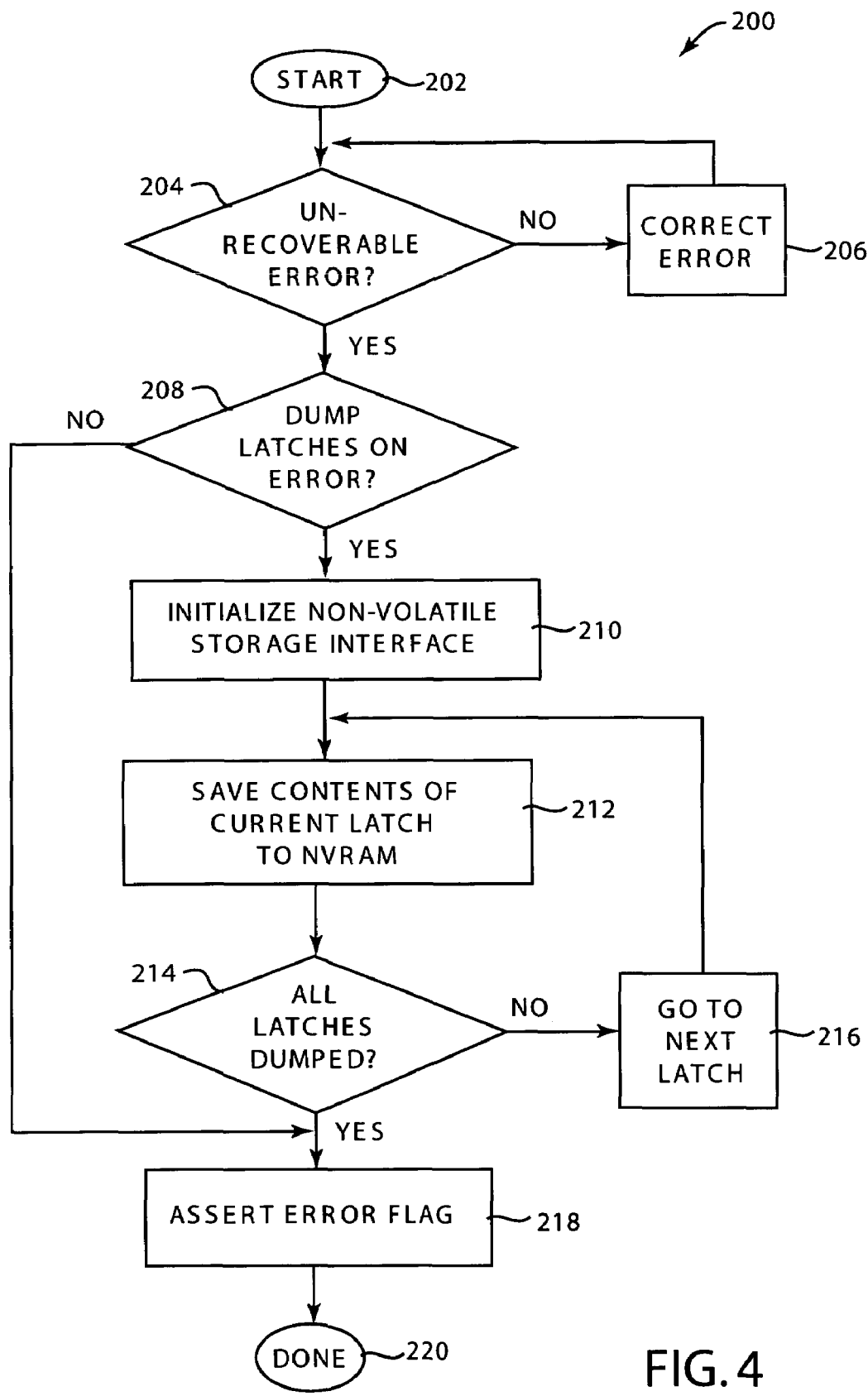
FIG. 4 is a flow diagram illustrating a method of the present invention for saving the state of an integrated circuit.

FIG. 4 is a flow diagram illustrating a method 200 of the present invention for saving the state of an integrated circuit upon failure. Programming instructions, data, code (or the equivalent in hardware such as logic gates, etc.) that implement the steps of this method can be stored by one or more computer readable media, such as memory, hard disk, magnetic tape, CD-ROM, DVD-ROM, storage device, or other medium, which is accessible to the appropriate controllers and devices described herein.

Any of the embodiments of FIGS. 1–3 can use the presently described process; the embodiment of FIG. 1 is used as an example in this description. The process begins at 202, and in step 204, the process checks whether an unrecoverable error has occurred in the particular ASIC 12 which is being monitored. Errors, such as a timeout occurring on a bus, a system memory failing, etc. can be detected using various well-known techniques. The error might be correctable, or unrecoverable. For example, a recoverable error can be a single bit error in data transferred over a parallel bus, which can be corrected by the ASIC using error checking and correction (ECC) information that is sent with the data. If, however (as an example), two or more bits are in error on the bus, the error may not be correctable with the ECC information and an unrecoverable error will have occurred. If an unrecoverable error has not occurred, the process continues to step 206, where the error is corrected or other appropriate action is taken. The process then returns to step 204 to check for an unrecoverable error during normal operation of the ASIC.

If an unrecoverable error has been detected in step 204, then in step 208, the process checks whether to dump the latches of the ASIC 12 based on the error. For example, the functionality of the present invention to dump the latches can be enabled or disabled by the user or operator or by programs running on the server, based on the desired operation of the ASIC. It should be noted that in the preferred embodiment, the process automatically dumps the state of the ASIC to memory (if enabled), rather than having to wait for a request from an external processor or other source to dump specific registers. In an alternate embodiment, the process can send out a notification to a user or operator or external processor (such as a service processor) that the error has occurred and wait for a specific request from the user/operator or external processor to dump the latches.

If latches are not to be dumped, the process continues to step 218, detailed below. If the latches are to be dumped, according to the present invention, then appropriate actions due to failure are taken, e.g., all internal clocks of the ASIC are stopped, etc., (the clocks can be stopped upon failure, regardless of whether latches are to be dumped or not in step 208) and the process continues to step 210.

In step 210, the non-volatile storage interface is initialized. The non-volatile storage interface allows data to be written to the NVRAM 18; for example, a write protect bit of the NVRAM can be changed to allow data to be written to it, data in the NVRAM or other bits can be zeroed, etc. In next step 212, the contents of the current latch are saved (or "dumped") to the NVRAM over the serial bus 16. The "current" latch is the first latch of the ASIC in the first iteration of this step, or another later-examined latch in later iterations. It should be noted that the current latch can be a latch that saves the state of registers of the ASIC, that saves the state of data paths of the ASIC, that saves the state of memory of the ASIC, or saves some other relevant state. Any or, in some embodiments, all of these types of latches may be useful for determining the state of the ASIC upon failure.

In step 214, the process checks whether all latches of the ASIC have been dumped to the NVRAM. If not, the process continues to step 216, where the next latch of the ASIC is examined, and the process then returns to step 212 to save the contents of that latch. Once all the latches have been dumped, the process continues from step 214 to step 218, in which an error flag is asserted. The error flag is a signal or other indication that is output from the ASIC to an appropriate device connected to the ASIC, where once the error flag is received, the appropriate device can take the appropriate action in the system and/or alert a user or operator of the computer device that includes the ASIC 12. For example, a separate service processor in a server can receive the error flag and can then reboot the server or remove power from the server, provide a notification to the user or operator of the server, etc. The process is then complete at 220.

A user or operator can then connect an external computer or other electronic device or debugging tool to the NVRAM in a debugging or test environment to read the data stored therein that was read from the latches of the ASIC. In some embodiments, the NVRAM can be removed from the circuit board to which it is connected so that its data can be read more conveniently, e.g., if the circuit board cannot be powered. The diagnosis and remedy for the failure of the ASIC can be assisted by the data obtained from the NVRAM describing the state of the ASIC at the time of failure. This can be convenient when, for example, replacing nonfunctioning circuit boards in a server or computer device and then taking the replaced, nonfunctioning circuit board to the testing environment to learn more particularly about the failure.

In the preferred embodiment described above, all or substantially all the latches of the ASIC are dumped to the NVRAM. It should be noted, however, that in some other embodiments, not all of the latches of the ASIC need be dumped or saved. For example, there may be one or more (generally a small number) of latches of an ASIC that offer irrelevant, redundant, or insignificant information for determining the state of the ASIC for debugging purposes, and thus those latches need not be saved upon failure. In most embodiments, substantially all the latches of the ASIC are saved for simplicity and to preserve the state of the ASIC in NVRAM.

The present invention can also be used in conjunction with multiple ASICs or other types of integrated circuits. Multiple integrated circuits in a system can be monitored and their states saved according to the present invention. In one such embodiment, each integrated circuit has its own dedicated state-saving controller functionality, its own dedicated NVRAM, and its own process 200 that is independent of other ASICs and integrated circuits. If one ASIC fails, the process 200 is implemented to save the state of that ASIC, while the other ASICs may continue to run normally (unless they depend on data or signals from the failed ASIC, at which point they might also fail and run process 200, e.g., due to timeouts). In another embodiment, multiple ASICs or other integrated circuits are all connected to a single state-saving controller (such as a bus master) via a bus such as a serial bus, and are all connected to a single NVRAM which saves the states of all the ASICs connected thereto upon failure of one or more of the ASICs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for saving the state of an integrated circuit, the system composing:
   a non-volatile memory; and
   a state-saving controller coupled to the non-volatile memory and coupled to the integrated circuit, wherein the state-saving controller saves the state of the integrated circuit to the non-volatile memory when an unrecoverable error occurs in the integrated circuit and after the internal clocks of the integrated circuit have been stopped so that latches of the integrated circuit retain their states upon the error in the operation of the integrated circuit.

2. The system of claim 1 wherein the state-saving controller saves the state of substantially all latches of the integrated circuit to the non-volatile memory when the unrecoverable error occurs in the integrated circuit.

3. The system of claim 2 wherein the state of each latch is saved when the unrecoverable error occurs in the intergrated circuit.

4. The system claim 1 wherein the integrated circuit is an Application Specific Integrated Circuit (ASIC).

5. The system of claim 1 wherein the non-volatile memory is an Electrically-Erasable Programmable Read only Memory (EEPROM).

6. The system of claim 1 wherein the state-saving controller is a separate component electrically coupled to the integrated circuit and to the non-volatile memory via a bus.

7. The system of claim 6 wherein the state-saving controller is a bus master of the bus.

8. The system of claim 6 wherein the bus is a serial bus.

9. The system of claim 1 wherein the state-saving controller is integrated with and internal to the integrated circuit.

10. The system of claim 1 wherein the non-volatile memory is a separate component electrically coupled to the integrated circuit by a bus.

11. The system of claim 1 wherein the non-volatile memory is integrated with and internal to the integrated circuit.

12. The system of claim 1 further comprising at least one additional integrated circuit, wherein the additional integrated circuit is coupled to the non-volatile, memory and to the state-saving controller, and wherein the state-saving controller saves the state of the additional integrated circuit to the non-volatile memory when a failure occurs in the additional integrated circuit.

13. The system of claim 1 wherein the saved state of the integrated circuit includes the data contents of registers and other latches of the integrated circuit.

14. A method for saving the state of an integrated circuit, the method comprising:
   determining that an unrecoverable error has occurred in the operation of the integrated circuit; and
   saving the state of the integrated circuit to a non-volatile memory coupled to the integrated circuit, the state saved after the unrecoverable error has been detected and after the internal clocks of the integrated circuit have been stopped so that latches of the integrated circuit retain their states upon the unrecoverable error in the operation of the integrated circuit.

15. The method of claim 14 wherein the states of substantially all latches of the integrated circuit are saved to the non-volatile memory.

16. The method of claim 14 wherein an error flag is asserted after the state of the integrated circuit has been saved.

17. The method of claim 16 wherein the error flag is provided to a service processor monitoring the operation of the integrated circuit.

18. The method of claim 14 wherein the state of the integrated circuit is saved by a state-saving controller coupled to the non-volatile memory and coupled to the integrated circuit.

19. The method of claim 14 wherein the integrated circuit is an Application Specific Integrated Circuit (ASIC).

20. The method of claim 14 further comprising:
   determining that an unrecoverable error has occurred in the operation of at least one additional integrated circuit, wherein the additional integrated circuit is coupled to the non-volatile memory; and
   saving the state of the at least one additional integrated circuit to the non-volatile memory when the unrecoverable error has been detected in the at least one additional integrated circuit.

21. The method of claim 18 wherein the state-saving controller is a separate component electrically coupled to the integrated circuit and to the non-volatile memory via a bus.

22. The method of claim 18 wherein the state-saving controller is integrated with and internal to the integrated circuit.

23. The method of claim 14 wherein the state of the integrated circuit is saved automatically upon the occurrence of the error, without receiving a request to save the state from a source outside the integrated circuit and state-saving controller.

24. The method of claim 14 wherein saving the state of the integrated circuit includes saving the data contents of registers and other latches of the integrated circuit.

25. A computer readable medium including program instructions to be implemented by a computer, the program instructions implementing steps for saving the state of an integrated circuit, the steps comprising:

determining that an unrecoverable error has occurred in the operation of the integrated circuit; and saving the state of the integrated circuit to a non-volatile memory coupled to the integrated circuit, the state saved after the unrecoverable error has been detected and after the internal clocks of the integrated circuit have been stopped so that the latches of the integrated circuit retain their states upon the unrecoverable error in the operation of the integrated circuit.

26. The computer readable medium of claim 25 wherein each latch of the integrated circuit is saved to the non-volatile memory.

27. The computer readable medium of claim 25 wherein an error flag is asserted after the state of the integrated circuit has been saved.

28. The computer readable medium of claim 27 wherein the error flag is provided to a service processor monitoring the operation of the integrated circuit.

29. The computer readable medium of claim 25 wherein the state of the integrated circuit is saved by a state-saving controller coupled to the non-volatile memory and coupled to the integrated circuit.

30. The computer readable medium of claim 25 wherein the program instructions implement steps farther comprising;

detecting an unrecoverable error in the operation of at least one additional integrated circuit, wherein the additional integrated circuit is coupled to the non-volatile memory; and saving the state of the at least one additional integrated circuit to the non-volatile memory when the unrecoverable error has been detected in the at least one additional integrated circuit.

31. The computer readable medium of claim 29 wherein the state-saving controller is a separate component electrically coupled to the integrated circuit and to the non-volatile memory via a bus.

32. The computer readable medium of claim 29 wherein the state-saving controller is integrated with and internal to the integrated circuit.

* * * * *